(12) United States Patent
Beer et al.

(10) Patent No.: US 7,595,476 B2
(45) Date of Patent: Sep. 29, 2009

(54) ELECTRICAL CIRCUIT, APPARATUS AND METHOD FOR THE DEMODULATION OF AN INTENSITY-MODULATED SIGNAL

(75) Inventors: Stephan Beer, Zurich (CH); Peter Seitz, Urdorf (CH)

(73) Assignee: CSEM Centre Suisse D'Electronique Et De Microtechnique SA, Neuchatel (CH)

( * ) Notice: Subject to any disclaimer, the term of this patent is extended or adjusted under 35 U.S.C. 154(b) by 924 days.

(21) Appl. No.: 10/548,753

(22) PCT Filed: Mar. 3, 2004

(86) PCT No.: PCT/CH2004/000122

§ 371 (c)(1),
(2), (4) Date: Sep. 8, 2005

(87) PCT Pub. No.: WO2004/082131

PCT Pub. Date: Sep. 23, 2004

(65) Prior Publication Data
US 2006/0097781 A1 May 11, 2006

(30) Foreign Application Priority Data
Mar. 10, 2003 (EP) .................. 03405164

(51) Int. Cl.
*H01J 40/14* (2006.01)
*G01J 4/00* (2006.01)
(52) U.S. Cl. .............. 250/214 R; 250/227.18
(58) Field of Classification Search ........... 250/214 R, 250/227.18, 227.23, 214 A, 214 LS, 214.1, 250/214 AG, 214 LA, 214 C, 214 SW; 356/73, 356/73.1; 327/44–47, 113–118
See application file for complete search history.

(56) References Cited

U.S. PATENT DOCUMENTS

| 4,281,245 A | * | 7/1981 | Brogardh et al. | ....... 250/227.23 |
| 4,547,737 A | | 10/1985 | Gibson | |
| 6,483,381 B1 | | 11/2002 | Shau | |

\* cited by examiner

*Primary Examiner*—Que T Le
*Assistant Examiner*—Don Williams
(74) *Attorney, Agent, or Firm*—Weingarten, Schurgin, Gagnebin & Lebovici LLP

(57) ABSTRACT

A modulated optical radiation field (I) whose modulation amplitude and temporal phase depend on the local position can be detected with a plurality of pixels 1. Each pixel 1 consists of a transducing stage (T) that converts incoming light (I) into a proportional electric signal, a sampling stage (S), two subtraction/summation stages (SUB1, SUM1; SUB2, SUM2), and an output stage. Each pixel can be addressed individually. The optical radiation field (I) is locally sensed and sampled at a frequency that is four times the wavefield's modulation frequency. The subtraction/summation stages (SUB1, SUM1; SUB2, SUM2) accumulate differences of two samples per modulation period, separated by half the period, during several averaging periods; the two stages are time shifted with respect to each other by a quarter period. The resulting two output signals are employed for the determination of the local envelope amplitude and the temporal phase. These pixels 1 can be realized with circuits that consume very little electric power require small areas, enabling the realization of large numbers of pixels in linear or two-dimensional array sensors.

20 Claims, 5 Drawing Sheets

ELECTRICAL CIRCUIT, APPARATUS AND METHOD FOR THE DEMODULATION OF AN INTENSITY-MODULATED SIGNAL

This application is a §371 national phase filing of PCT/CH2004/000122 filed Mar. 3, 2004, and claims priority to a European application No. 03405164.9 filed Mar. 10, 2003.

FIELD OF THE INVENTION

This invention generally relates to all sensing and measurement techniques that rely on temporally modulated signals, preferably optical radiation fields, whose local variation of amplitude and phase must be measured as a function of time. More particularly, it relates to all of these sensing and measurement techniques that require dense one- or two-dimensional arrays of such amplitude- and phase-sensitive demodulation pixels. These techniques include optical coherence tomography (OCT), time-of-flight (TOF) range imaging and multiple wave interferometry.

BACKGROUND OF THE INVENTION

Many optical sensing and measurement techniques are known that are based on temporally modulated optical radiation fields whose local amplitude and phase vary as a function of time. These techniques require the spatially and temporally resolved determination of amplitude and phase, the so-called demodulation of the modulated radiation field. While several electronic circuits and digital signal processing algorithms exist that can provide this demodulation function for a single measurement spot, none of these solutions allow the integration into dense, massively parallel and reliably operating arrays of demodulation photosensors.

A standard AM-demodulation consists of band-pass filtering, rectifying, and low-pass filtering the input signal. This technique is widely known for AM radio receivers. Its disadvantage is the need for large RC-constants for frequencies below 10 kHz, which are not compatible with the small pixel size and the new CMOS processes.

Direct detection by multiplying the input signal on one path with an oscillator signal matching the carrier frequency and on a second path with the oscillator's 90-degrees shifted signal allows detection of amplitude and phase. But signal multiplication is complex and power consuming compared to the power available in each pixel (typically a few μW) and therefore not suited for massive parallel integration in a pixel field.

Several digital demodulation techniques are known based on oversampling the input signal. Due to the Nyquist Sampling theorem, the sampling rate must be more than twice the input-signal bandwidth. Digital signal demodulation algorithms are normally too complex to be implemented into a pixel (more than 50 transistors). The following non-exhaustive list gives an overview of digital demodulation techniques:

A widely used method applies a discrete Fourier transform, removes negative and zero frequency components and re-centers the spectrum before reverse transforming. This method is described in S. S. C. Chim and G. S. Kino, "Correlation microscope," Opt. Lett. 15, pp. 579-581, 1990.

If the input signal is sampled at a frequency that is four times the input signal modulation frequency, different algorithms for local envelope detection are known. An evaluation can be found in K. G. Larkin, "Efficient nonlinear algorithm for envelope detection in white light interferometry," J. Opt. Soc. Am. 13, pp. 832-843, 1996. But all of them imply multiplication and are therefore not applicable in a power efficient pixel structure.

SUMMARY OF THE INVENTION

It is an object of the invention to provide an electric circuit with which the spatially and temporally resolved amplitude and phase of a temporally modulated signal can be detected for the purpose of demodulation, but which do not suffer from the disadvantages of the prior art. The circuits should be integrable in dense one- or two-dimensional arrays due to their compact size, low electric power consumption, simplicity of driving, independent signal pre-processing capabilities and robustness of operation regarding fabrication tolerances of semiconductor processes. It is a further object of the invention to provide a one- or two-dimensional array sensor and an apparatus for the spatially and temporally resolved demodulation of a modulated signal. It is still another object of the invention to provide a method for the detection of a modulated signal. These and other objects are achieved by the electric circuit, the array sensor, the apparatus and the method defined in the independent claims. Advantageous embodiments are defined in the dependent claims.

The invention separates the envelope detection into two different tasks:
 (i) a low-power data compression part for in-pixel integration, and
 (ii) the final amplitude and phase reconstruction, which involves multiplication and can be done in-pixel if the constraints admit it or off-pixel or even off-chip depending on the requirements.

The electrical circuit according to the invention performs the first (i) of the two above-identified tasks. The input signal is locally sensed and sampled at a frequency that is four times the modulation frequency of the signal. Subtraction/summation stages accumulate differences of two samples per modulation period, separated by half the period, during several averaging periods; the two stages are time shifted with respect to each other by a defined or predetermined fraction of the modulation period, preferably a quarter period. The resulting two output signals are employed for the determination of the local envelope amplitude and the temporal phase in the second task (ii), representing a mean over the averaging periods. These electrical circuits can be realized with circuits that consume very little electric power and require small areas, enabling the realization of large numbers of pixels in linear or two-dimensional array sensors.

Accordingly, the inventive electrical circuit for the detection of a signal modulated with a modulation frequency, a modulation period being defined as the inverse of the modulation frequency, comprises transduction means for transducing the modulated signal into an electrical signal, sampling means for sampling said electrical signal with a sampling frequency which is equal to four times the modulation frequency or a multiple thereof, first subtraction means for evaluating a first difference between two first samples separated by half the modulation period, and second subtraction means for evaluating a second difference between two second samples separated by half the modulation period, said second samples being time-shifted with respect to said first samples by a defined or predetermined fraction of the modulation period, preferably a quarter period. The electrical circuit further comprises first summation means for evaluating a first sum of a plurality of subsequent first differences evaluated by said first subtraction means, and second summation means for evaluating a second sum of a plurality of subsequent second differences evaluated by said second subtraction means.

The one-dimensional or two-dimensional array sensor according to the invention comprises a plurality of pixels, at least one, and preferably each, of which comprises an electrical circuit according to the invention.

The inventive apparatus for the demodulation of a modulated signal comprises detection means for detecting the modulated signal, and evaluation means for evaluating an envelope amplitude and/or a temporal phase from an output of said detection means. Said detection means comprise an electrical circuit according to the invention.

The method for the detection of a signal modulated with a modulation frequency, a modulation period being defined as the inverse of the modulation frequency, comprises the steps of transducing the modulated signal into an electrical signal, sampling said electrical signal with a sampling frequency which is equal to four times the modulation frequency or a multiple thereof, evaluating a first difference between two first samples separated by half the modulation period, and evaluating a second difference between two second samples separated by half the modulation period, said second samples being time-shifted with respect to said first samples by a defined or predetermined fraction of the modulation period, preferably a quarter period. A first sum of a plurality of subsequent first differences is evaluated, and a second sum of a plurality of subsequent second differences is evaluated.

It is not necessary that the phase shift between the sampled signals is exactly a quarter of the modulation period. Numerical methods are known to treat non-uniform sampling grids to extract the mathematically correct values for amplitude and phase of the modulation (cf. A. B. Cain, and J. H. Ferziger and W. C. Reynolds, "Discrete orthogonal function expansion for non-uniform grids using the fast Fourier transform", J. computational physics 56, pp. 272-286, 1984).

The electrical circuit according to the invention can be used for any input signals such as electromagnetic, ultrasonic or chemical signals. However, in the following, the invention is discussed for the example of an optical signal.

BRIEF DESCRIPTION OF THE DRAWINGS

Embodiments of the invention are described in greater detail hereinafter relative to the attached schematic drawings.

DESCRIPTION OF PREFERRED EMBODIMENTS

Figure 1:
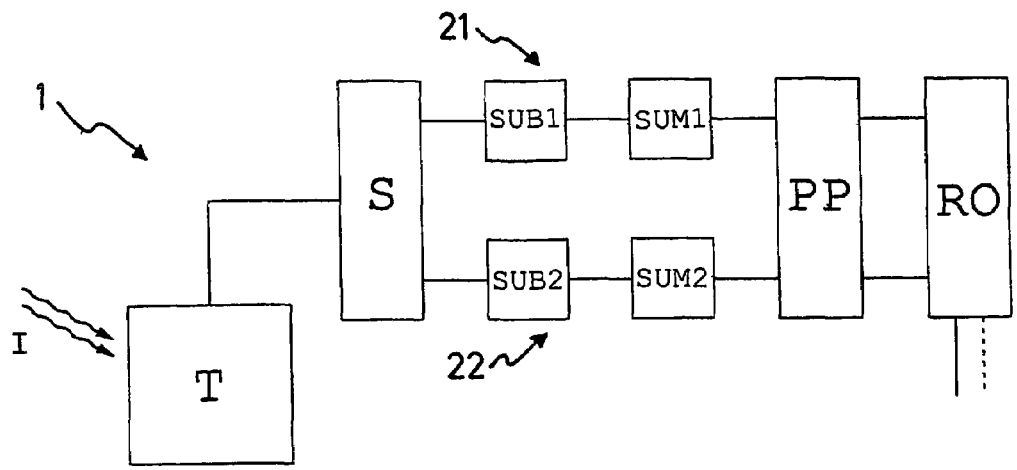
FIG. 1 shows a block diagram of the demodulation pixel according to the invention.

FIG. 1 shows a block diagram of an electrical circuit 1 or a demodulation pixel according to the invention. The electrical circuit 1 comprises a transduction stage T, a sampling or sample and hold stage S, two subtraction stages SUB1 and SUB2, two summation stages SUM1 and SUM2, a signal preprocessing stage PP and a readout stage RO. After the sampling stage S, the signal path is split into two channels 21, 22: a first channel 21 includes the first subtraction stage SUB1 and behind it the first summation stage SUM1, and a second channel 22 includes the second subtraction stage SUB2 and behind it the second summation stage SUM2.

An input signal I, which is preferably an optical radiation field, is sensed in the transduction stage T and transduced to an electrical signal of any kind (e.g., charge, voltage or current as described for example in U.S. Pat. No. 6,469,489 by S. Bourquin and P. Seitz). The transduction stage T may have an approximate or exact offset compensation, non-linear signal compression or both of these. Offset compensation and signal compression increase the dynamic range of the detection system, since the input signal may have a large DC offset, which carries no useful information for the demodulation process.

The sampling stage S samples the electrical signal S with a frequency that is four times the modulation frequency f:

$$S_i = S(t_i),$$

where $$t_i = i/4_f.$$

This can be done by switches or similar devices. In the simplest case the switch is a single field-effect transistor (FET) for voltage or current signals or a charge-coupled-device (CCD) gate for charge signals. A drift field demodulation pixel (cf. patent application No. GB-0214257.8) or a pixel using the lock-in principle (cf. WO-96/15626) can replace the transduction stage T and the sampling stage S.

The subtraction stages SUB1, SUB2 determine the difference between two samples separated by half the modulation period. The two subtraction stages SUB1, SUB2 are time-shifted with respect to each other by a quarter period. Their signals $d_k^I$ and $d_k^{II}$ are given by $$d_k^I = S_{4k+2} - S_{4k} \text{ for SUB1 and}$$

$$d_k^{II} = S_{4k+3} - S_{4k+1} \text{ for SUB2.}$$

Each subtraction stage SUB1 and SUB2 is followed by its corresponding summation stage SUM1 and SUM2, respectively. A summation stage SUM1, SUM2 builds the sum of a certain number N of differences:

$$a^j = \sum_{k=0}^{N} d_k^j,$$

where j=I,II for SUM1 and SUM2, respectively. The summation stages SUM1, SUM2 might have a non-linear signal compression to increase the dynamic of the detection system.

The pre-processing stage PP allows integration of certain additional functionalities such as calculation of the ratio of the two summation signals or the sum of their squares, etc. A second sample and hold stage might be included if necessary. The pre-processing stage PP might also be a pass-through.

The readout stage RO serves to read out the signals from the pre-processing stage PP. It may support parallel or sequential data transmission. A third sample and hold stage can be included to make the readout timing independent of the synchronous functioning of the subtraction and summation stages SUB, SUM. The readout stage is preferably laid out for random addressing.

All stages are synchronized on the modulation frequency f or a multiple or a fraction of it.

In the following, preferred embodiments of circuits for the pixel stages T, S, SUB, SUM, PP, RO are discussed.

Figure 2:
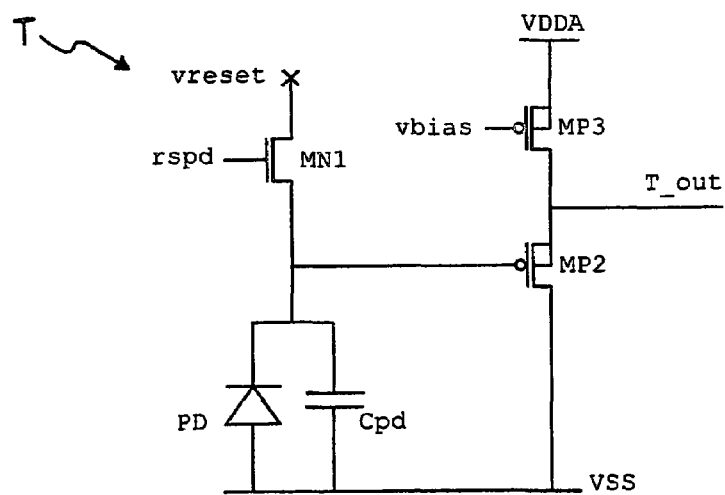
FIG. 2 shows a circuit diagram of a transduction stage that converts photons into a corresponding voltage in the demodulation pixel according to the invention.

FIG. 2 shows an embodiment of the transduction stage T that converts photons I to a corresponding voltage. The circuit is fed by a ground voltage VSS and a supply voltage VDDA. A photodiode PD is the photons-sensing element and has an internal capacitance Cpd. Absorbed photons create a negative electronic charge on the positively precharged capacitance, resulting in a voltage drop. The resulting voltage is amplified by a source follower (unity gain, high input impedance, low output impedance) formed by two p-channel MOS transistors MP2 and MP3, where MP3 is the current source. The bias voltage at the gate of MP3 vbias defines the current used by the source follower. An output line of the transduction stage T is designated by T_out. The photodiode PD is reset after a certain time to a fixed voltage vreset by the n-channel MOS transistor MN1 in order to subtract the DC offset. The photodiode reset signal rspd controls transistor MN1.

Figure 3:
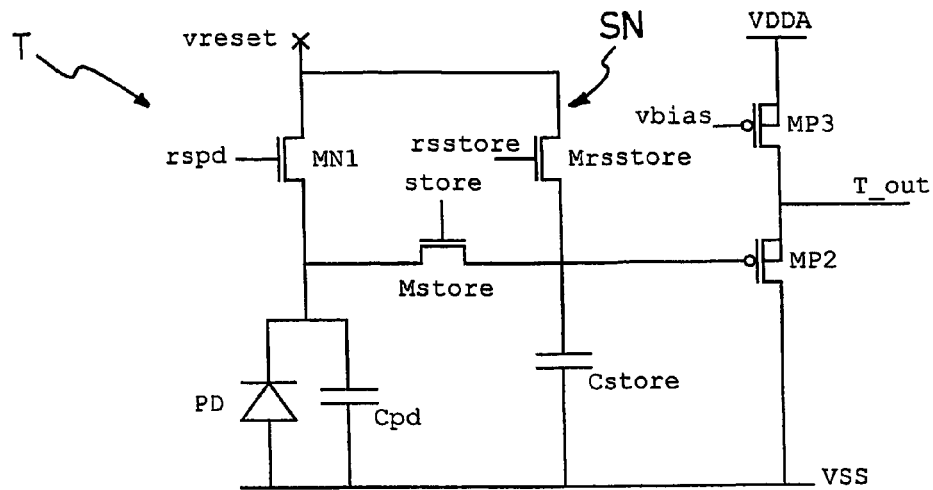
FIG. 3 shows a variation of the transduction stage shown in FIG. 2 wherein a storage node has been added.

The transduction stage T can be enhanced by a storage node SN, which allows to reduce the bandwidth of the source follower as well as of the following circuitry and thus reduces the noise in the system. This modified embodiment of the transduction stage T is illustrated in FIG. 3. The n-channel MOS transistors Mstore and Mrsstore function as switches controlled by their gate voltages store and rsstore, respectively. Before resetting the photodiode PD, the switch Mstore is closed and opened again to sample the voltage on the photodiode PD onto the capacitor Cstore. The voltage stored on Cstore is amplified by the source follower MP2, MP3. Then the switch Mrsstore closes and opens again, thus resetting the voltage on Cstore to the voltage vreset.

Figure 4:
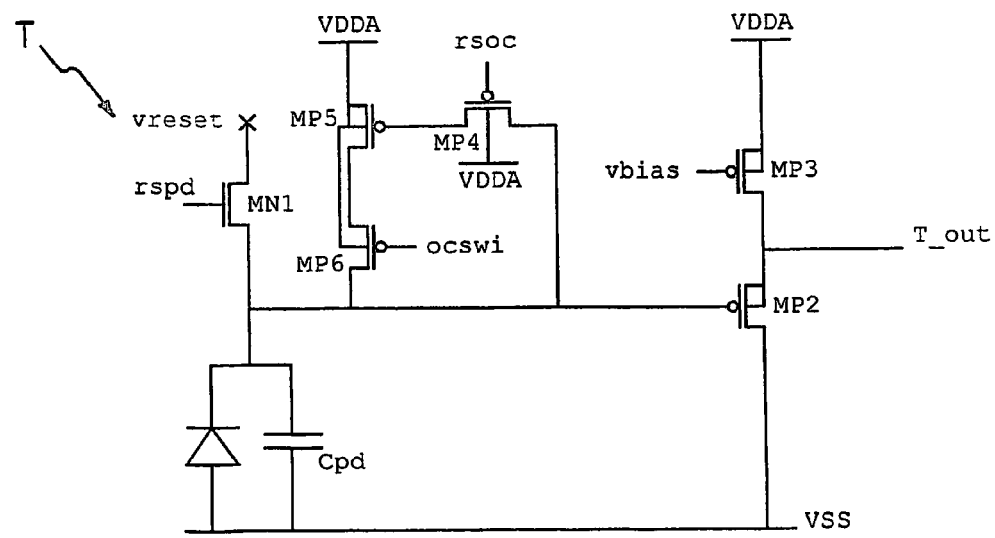
FIG. 4 shows a circuit diagram of a transduction stage with improved offset compensation in the demodulation pixel according to the invention.

A further modification of the transduction stage T improves the offset compensation: a current source MP5, which introduces a current equivalent to the photogenerated DC current through the photodiode PD, is connected in series with the photodiode PD. FIG. 4 shows a possible implementation. Two operation modes are possible:

Calibrated current compensation: A transistor MP4 is used as a switch. A current source MP5 behaves like a forward biased diode when the switch MP4 is closed, and the compensation current matches exactly the photogenerated current. When the switch MP4 opens again, the current through MP5 becomes independent of the photocurrent variations.

Low-pass filtered current compensation: The transistor MP4 is used as a resistance, forming a low-pass filter with the gate capacitance of transistor MP5. An additional capacitor might be needed to adapt the cut-off frequency of this filter. The current source MP5 generates a compensation current, which is independent of photocurrent variations of frequencies higher than the cut-off frequency of the filter.

The modes are selected by choosing the correct gate voltage rsoc of MP4.

The transistor MP6 is an additional switch, which allows to switch off this improved offset compensation. The voltage ocswi controls the switch MP6.

Figures 5A, 5B, 5C:
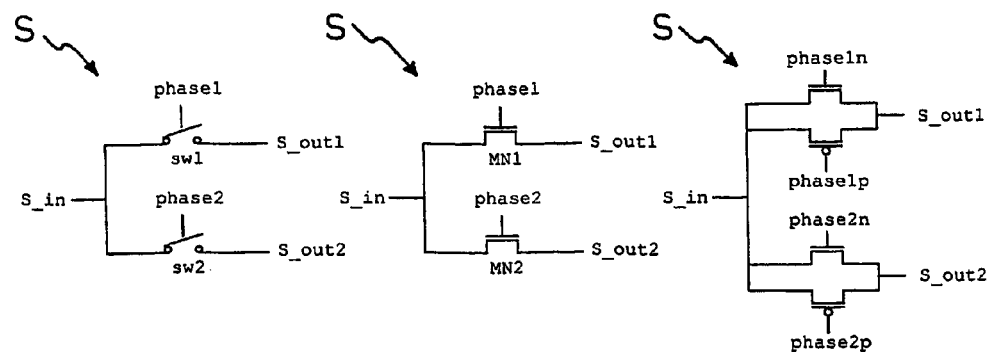
FIGS. 5(a)-(c) show three types of sampling stages in the demodulation pixel according to the invention: (a) switches, (b) NMOS switches, (c) transmission gates.

The sampling stage S can be built of simple switches, e.g., NMOS switches or transmission gates as shown in FIGS. 5(a), 5(b) and 5(c), or it can contain a storage node. Additional storage nodes allow sample and hold operation.

Figure 6:
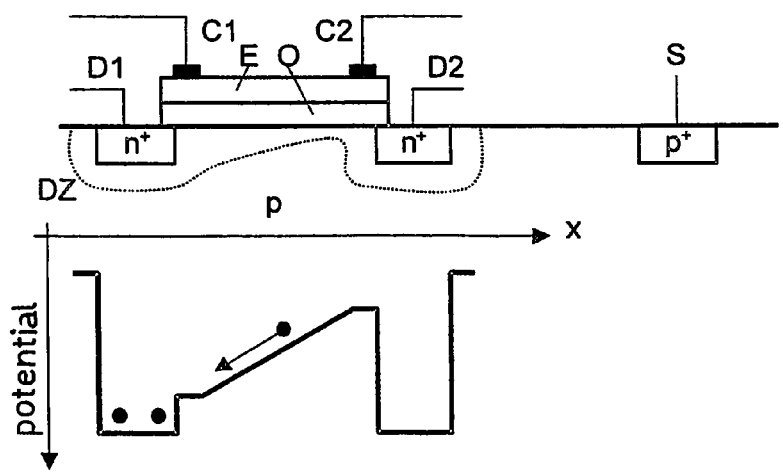
FIG. 6 shows a cross-section of a drift field modulation pixel according to the invention.
Figure 7:
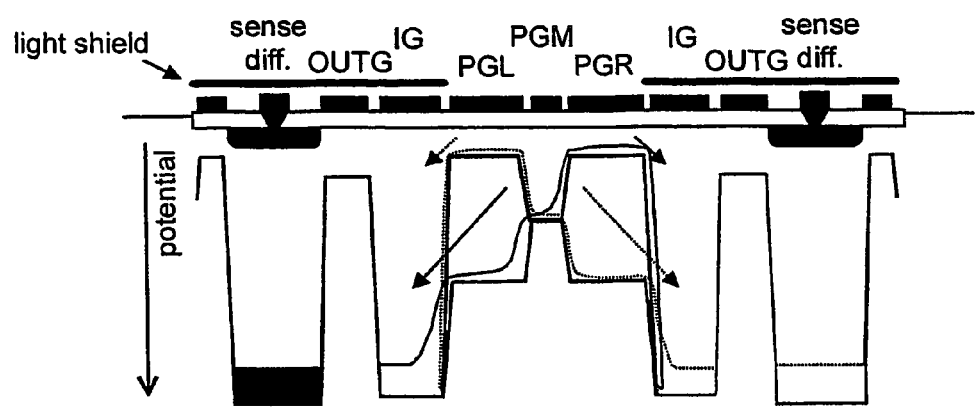
FIG. 7 shows a cross-section of a lock-in pixel according to the invention.

The transduction stage T and the sample and hold stage S may be combined into one device, e.g., a drift field modulation pixel as shown in FIG. 6 or a lock-in pixel as shown in FIG. 7. These types of pixels are described in patent applications No. GB-0214257.8 and WO-96/15626, which are incorporated herein by reference.

Figure 8:
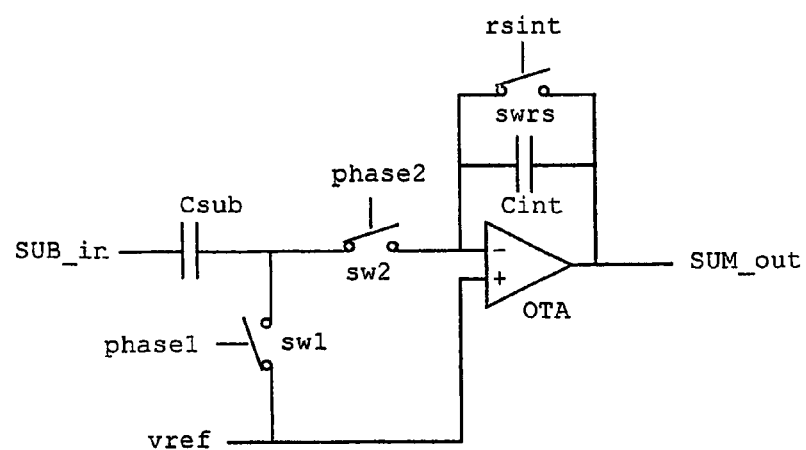
FIG. 8 shows a circuit diagram of a circuit containing a subtraction stage and a summation stage.

FIG. 8 shows an implementation of one of the subtraction stages SUB1 or SUB2 and its allocated summation stage SUM1 or SUM2, respectively. Phase1 and phase2 are non-overlapping opposite phase clocks. During phase1, a charge proportional to the voltage difference between the first sample of the sampled signal and a reference voltage vref is stored on a capacitor Csub. During phase2, a charge proportional to the voltage difference between the next sample of the sampled signal and the voltage at the negative input of an operational transconductance amplifier OTA, which approximates vref, is stored. The charge difference on the capacitor Csub between phase1 and phase2 is added to the charge on a capacitor Cint. This process is repeated a certain number of times. The output signal of this stage is therefore proportional to the sum of the voltage differences.

Examples of the pre-processing stage PP include a signal-squaring stage calculating the sum of the squares of the summation stage signals, $$e=(a^I)^2+(a^{II})^2,$$

or a stage calculating their ratio $$q=a^I/a^{II}.$$

Such circuits are per se known from standard textbooks on semiconductor circuits.

Figure 9:
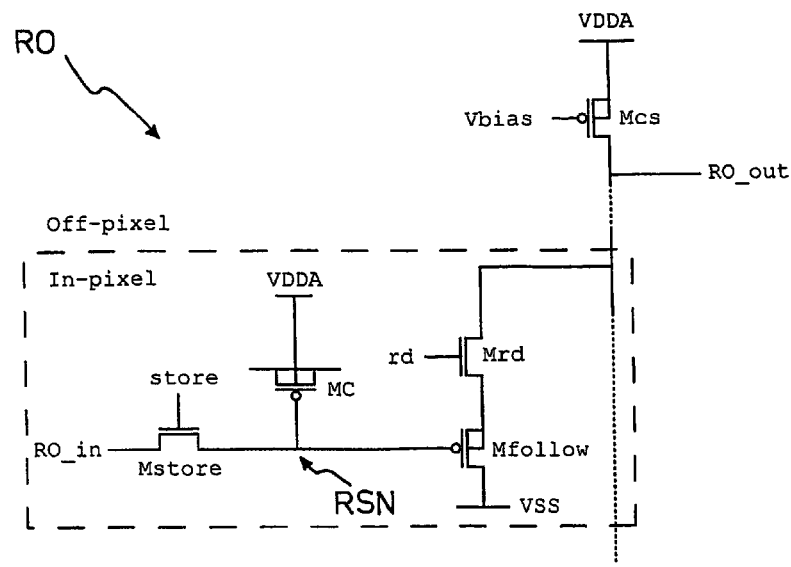
FIG. 9 shows a circuit diagram of a readout stage in the demodulation pixel according to the invention.

FIG. 9 shows an embodiment of a readout stage RO for one signal RO_in with a storage node. The signal RO_in is sampled through a switch Mstore into a readout storage node RSN. The capacitance of the readout storage node RSN is increased by a moscap MC to reduce the noise. When a read switch Mrd is closed, the signal is driven off-pixel by a source follower built of the MOS transistors Mfollow and Mcs.

Figure 10:
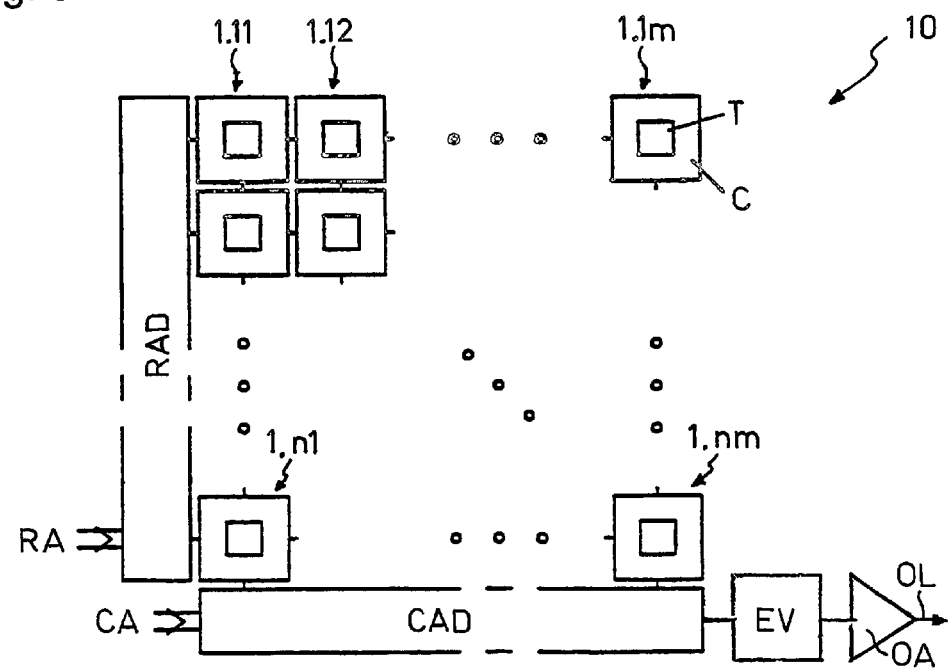
FIG. 10 schematically shows a two-dimensional array sensor according to the invention.

A plurality of electrical circuits $1.11, 1.12, \ldots, 1.1m; \ldots 1.nm$ as shown in FIG. 1 can be stacked in a one- or two-dimensional array, as shown in FIG. 10. Each of the circuits $1.11$-$1.nm$ consists of a photodiode and electronic circuitry C comprising the stages S, SUB, SUM, PP and RO described with reference to FIG. 1. Thus, the circuits $1.11$-$1.nm$ form the pixels of an array sensor, which itself is part of an apparatus 10 for the demodulation of a modulated signal according to the invention. The apparatus 10 comprises a column address decoder CAD and a row address decoder RAD for selecting one circuit after the other by indicating the corresponding column address CA and row address RA. The address decoders CAD, RAD are used to read out the outputs of each circuit $1.11$-$1.nm$ serially. Their electrical schematic is known art and is therefore not described here.

The column address decoder CAD can be followed by evaluation means EV for on-chip evaluating of an envelope amplitude and/or a temporal phase from outputs of the electrical circuits. Such evaluation means EV are well-known. The evaluation means EV might be omitted if the envelope amplitude and temporal phase evaluation is done off-chip. Finally, an output amplifier OA yields an apparatus output signal on an output line OL.

It should be noted that in a two-dimensional sensor according to the invention, the circuits 1.11-1.nm may be arranged in a different way than in rows and columns as shown in FIG. 10. Any kind of arrangement falls within the scope of the invention.

This invention is not limited to the preferred embodiments described above, to which variations and improvements may be made, without departing from the scope of protection of the present patent.

LIST OF REFERENCE SIGNS

1 Electrical circuit
10 Apparatus
21 First channel
22 Second channel
CA Column address
CAD Column address decoder
EV Evaluation means
I Input signal
OA Output amplifier
OL Output line
OTA Operational transconductance amplifier
PD Photodiode
PP Pre-processing stage
RA Row address
RAD Row address decoder
RO Readout stage
RSN Readout storage node
S Sampling stage
SN Storage node
SUB1, SUB2 Subtraction stages
SUM1, SUM2 Summation stages
T Transduction stage
VDDA Supply voltage
VSS Ground voltage

The invention claimed is:

1. An electrical circuit for the detection of a signal (I) modulated with a modulation frequency, a modulation period being defined as the inverse of the modulation frequency, comprising:
transduction means (T) for transducing the modulated signal (I) into an electrical signal,
sampling means (S) for sampling said electrical signal with a sampling frequency which is equal to four times the modulation frequency or a multiple thereof,
first subtraction means (SUB1) for evaluating a plurality of first difference between two samples per modulation period, each separated by half the modulation period, and
second subtraction means (SUB2) for evaluating a plurality of second difference between two samples per modulation period, each separated by half the modulation period, said second samples being time-shifted with respect to said first samples by a defined fraction, preferably a quarter, of the modulation period,
characterized by
first summation means (SUM1) for evaluating a first sum of a plurality of subsequent first differences evaluated by said first subtraction means (SUB1), and
second summation means (SUM2) for evaluating a second sum of a plurality of subsequent second differences evaluated by said second subtraction means (SUB2).

2. The electrical circuit according to claim 1, wherein said transduction means (T) comprise a photodiode (PD) and preferably a source follower (MP2, MP3) for amplifying an electrical output signal of said photodiode (PD).

3. The electrical circuit according to claim 2, wherein a storage node (SN) is arranged between said photodiode (PD) and said source follower (MP2, MP3).

4. The electrical circuit according to claim 3, wherein a current source (MP5) for introducing a current equivalent to a photogenerated DC current through said photodiode (PD) is connected in series with said photodiode (PD).

5. The electrical circuit according to claim 4, wherein said sampling means (S) comprise at least two switches and/or a storage node.

6. The electrical circuit according to claim 5, further comprising:
pre-processing means (PP) for pre-processing said first and second sum evaluated by said first and second summation means (SUM1, SUM2), respectively, e.g., for calculating a sum of the squares of said first and second sums or for calculating a ratio of said first and second sums; and
readout means (RO) for reading out an output signal of said electrical circuit.

7. A one-dimensional or two-dimensional array sensor comprising a plurality of pixels (1.11-1.nm),
characterized in that
at least one, and preferably each, of said pixels (1.11-1.nm) comprises an electrical circuit according to claim 6.

8. An apparatus for the demodulation of a modulated signal (I), comprising:
detection means for detecting the modulated signal (I), and evaluation means (EV) for evaluating an envelope amplitude and/or a temporal phase from an output of said detection means,
characterized in that
said detection means comprise an electrical circuit (1.11-1.nm) according to claim 6.

9. The electrical circuit according to claim 2, wherein a current source (MP5) for introducing a current equivalent to a photogenerated DC current through said photodiode (PD) is connected in series with said photodiode (PD).

10. A one-dimensional or two-dimensional array sensor comprising a plurality of pixels (1.11-1.nm),
characterized in that
at least one, and preferably each, of said pixels (1.11-1.nm) comprises an electrical circuit according to claim 9.

11. An apparatus for the demodulation of a modulated signal (I), comprising:
detection means for detecting the modulated signal (I), and evaluation means (EV) for evaluating an envelope amplitude and/or a temporal phase from an output of said detection means,
characterized in that
said detection means comprise an electrical circuit (1.11-1.nm) according to claim 9.

12. The electrical circuit according to claim 1, wherein said sampling means (S) comprise at least two switches and/or a storage node.

13. The electrical circuit according to claim 1, wherein said transduction means (T) and said sampling means (S) are combined into one element, e.g., a drift field modulation pixel or a lock-in pixel.

14. The electrical circuit according to claim 1, further comprising pre-processing means (PP) for pre-processing said first and second sum evaluated by said first and second summation means (SUM1, SUM2), respectively, e.g., for calculating a sum of the squares of said first and second sums or for calculating a ratio of said first and second sums.

15. The electrical circuit according to claim 1, further comprising readout means (RO) for reading out an output signal of said electrical circuit.

16. A one-dimensional or two-dimensional array sensor comprising a plurality of pixels (1.11-1.*nm*), characterized in that at least one, and preferably each, of said pixels (1.11-1.*nm*) comprises an electrical circuit according to claim 1.

17. An apparatus for the demodulation of a modulated signal (I), comprising:

detection means for detecting the modulated signal (I), and evaluation means (EV) for evaluating an envelope amplitude and/or a temporal phase from an output of said detection means, characterized in that said detection means comprise an electrical circuit (1.11-1.*nm*) according to claim 1.

18. The apparatus according to claim 17, wherein said detection means comprise a plurality of pixels (1.11-1.*nm*) with parallel outputs, at least one, and preferably each, of said pixels (1.11-1.*nm*) comprising said electrical circuit, and wherein said apparatus further comprises at least one on-chip address decoder (CAD. RAD) for individually reading out each electrical circuit (1.11-1.*nm*).

19. A method for the detection of a signal (I) modulated with a modulation frequency, a modulation period being defined as the inverse of the modulation frequency, comprising the steps of:

transducing the modulated signal (I) into an electrical signal, sampling said electrical signal with a sampling frequency which is equal to four times the modulation frequency or a multiple thereof, evaluating a plurality of first difference between two samples per modulation period, each separated by half the modulation period, and evaluating a plurality of second difference between two samples per modulation period, each separated by half the modulation period, said second samples being time-shifted with respect to said first samples by a defined fraction, preferably a quarter, of the modulation period, characterized in that a first sum of a plurality of subsequent first differences is evaluated, and a second sum of a plurality of subsequent second differences is evaluated.

20. The method according to claim 19, wherein said first and second sum are pre-processed prior to being used for evaluating an envelope amplitude and/or a temporal phase of the modulated signal (I), e.g., a sum of the squares of said first and second sums or a ratio of said first and second sums is calculated.

* * * * *

UNITED STATES PATENT AND TRADEMARK OFFICE
CERTIFICATE OF CORRECTION

PATENT NO. : 7,595,476 B2　　　　　　　　　　　　　　　　　　　Page 1 of 1
APPLICATION NO. : 10/548753
DATED : September 29, 2009
INVENTOR(S) : Beer et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1054 days.

Signed and Sealed this

Twenty-eighth Day of September, 2010

David J. Kappos
*Director of the United States Patent and Trademark Office*